United States Patent
Kim et al.

(10) Patent No.: US 8,558,360 B2
(45) Date of Patent: Oct. 15, 2013

(54) FLIP CHIP PACKAGE AND METHOD OF MANUFACTURING THE SAME

(75) Inventors: Ey Yong Kim, Daejeon (KR); Young Hwan Shin, Daejeon (KR); Soon Jin Cho, Chungcheongbuk-do (KR); Jong Yong Kim, Daejeon (KR); Jin Seok Lee, Chungcheongbuk-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 307 days.

(21) Appl. No.: 12/926,137

(22) Filed: Oct. 27, 2010

(65) Prior Publication Data
US 2011/0095421 A1  Apr. 28, 2011

(30) Foreign Application Priority Data
Oct. 28, 2009 (KR) .......................... 10-2009-0103000

(51) Int. Cl.
H01L 21/02 (2006.01)
(52) U.S. Cl.
USPC .... 257/669; 257/672; 257/782; 257/E21.499; 257/E23.065; 257/E23.068
(58) Field of Classification Search
USPC ............... 257/668–787, E21.499–502, 23.08, 257/65–68, 125
See application file for complete search history.

(56) References Cited

U.S. PATENT DOCUMENTS

| | | | |
|---|---|---|---|
| 5,725,819 A | 3/1998 | Onishi et al. | |
| 6,331,451 B1 * | 12/2001 | Fusaro et al. | 438/126 |
| 6,580,159 B1 * | 6/2003 | Fusaro et al. | 257/668 |
| 2010/0139962 A1 * | 6/2010 | Kaneko | 174/260 |
| 2012/0126395 A1 * | 5/2012 | Lee et al. | 257/737 |
| 2012/0241942 A1 * | 9/2012 | Ihara | 257/712 |

FOREIGN PATENT DOCUMENTS

| | | |
|---|---|---|
| CN | 101061577 | 10/2007 |
| JP | 63-66953 | 3/1988 |
| JP | 02-130857 | 5/1990 |
| JP | 03-238850 | 10/1991 |
| JP | 04-312933 | 11/1992 |
| JP | 08-85285 | 4/1996 |
| JP | 2002-151833 | 5/2002 |
| JP | 2004-179576 | 6/2004 |
| JP | 2007-157963 | 6/2007 |
| JP | 2007-180089 | 7/2007 |
| JP | 2007-250884 | 9/2007 |

(Continued)

OTHER PUBLICATIONS

Chinese Office Action issued Sep. 26, 2012 in corresponding Chinese Patent Application No. 201010529771.1.
Japanese Office Action issued Jun. 5, 2012 issued in corresponding Japanese Patent Application No. 2010-241168.

(Continued)

*Primary Examiner* — Michael Lebentritt

(57) ABSTRACT

There is provided a flip chip package including an electronic device, a board including a conductive pad disposed inside a mounting region of the board on which the electronic device is mounted, and a connection pad disposed outside the mounting region, a resin layer formed on the board and including a trench formed by removing a part of the resin layer, and a dam member provided on the trench and preventing the leakage of an underfill between the mounting region and the connection pad. Since the dam member, formed on the processed resin layer, can prevent the leakage of the underfill, a package defect rate can be lowered, and connection reliability can be improved.

15 Claims, 4 Drawing Sheets

(56) References Cited

FOREIGN PATENT DOCUMENTS

| JP | 2008-88327 | 4/2008 |
|---|---|---|
| JP | 2008-169242 | 7/2008 |
| KR | 10-2007-0017671 | 2/2007 |
| WO | 2004/038769 | 5/2004 |

OTHER PUBLICATIONS

Chinese Office Action mailed May 2, 2013 for corresponding Chinese Application No. 201010529771.1.
Japanese Office Action issue Nov. 6, 2012 in corresponding Japanese Patent Application No. 2010-241168.

* cited by examiner

FLIP CHIP PACKAGE AND METHOD OF MANUFACTURING THE SAME

CROSS-REFERENCE TO RELATED APPLICATIONS

This application claims the priority of Korean Patent Application No. 10-2009-0103000 filed on Oct. 28, 2009, in the Korean Intellectual Property Office, the disclosure of which is incorporated herein by reference.

BACKGROUND OF THE INVENTION

1. Field of the Invention

The present invention relates to a flip chip package and a method of manufacturing the same, and more particularly, to a flip chip package capable of lowering a package defect rate and achieving more reliable connections by preventing the leakage of underfill.

2. Description of the Related Art

Due to the recent development of slimmer and smaller electronic devices with higher functionality, there is an increasing demand for high density mounting technologies for mounting electronic devices on a board. Chip-scale packaging technologies have emerged accordingly.

When an electronic device is mounted on a printed circuit board, a gap between the printed circuit board and the electronic device is filled with an underfill to thereby reinforce a connection between the printed circuit board and the electronic device. In such a manner, a reliable connection therebetween is ensured. However, a certain amount of underfill, utilizing a liquid resin, undesirably leaks to a surrounding region at the time when it is injected into the gap between the board and the electronic device.

As for a package according to the related art, a semiconductor chip is mounted on the central portion of a printed circuit board, and connection pads for electrical connections with external devices are arranged densely around the semiconductor chip. In addition, an underfill is injected into a gap between the semiconductor chip and the printed circuit board. This underfill utilizes a liquid resin, and a certain amount of underfill undesirably leaks to the outside.

However, since an electronic device and circuit patterns are mounted densely on a board according to the current tendency, the underfill, having leaked, may reach an adjacent connection pad or circuit pattern. This may contaminate the adjacent connection pad or circuit pattern, causing defects in products.

SUMMARY OF THE INVENTION

An aspect of the present invention provides a flip chip package capable of lowering a package defect rate and ensuring more reliable connections by preventing the leakage of an underfill by using a dam member formed on a processed resin layer, and a method of manufacturing the same.

According to an aspect of the present invention, there is provided a flip chip package including: an electronic device; a board including a conductive pad disposed inside a mounting region of the board on which the electronic device is mounted, and a connection pad disposed outside the mounting region; a resin layer disposed on the board and including a trench formed by removing a part of the resin layer; and a dam member provided on the trench and preventing leakage of an underfill between the mounting region and the connection pad.

The trench may be formed by processing the resin layer using a laser.

The trench may be formed by exposing and developing the resin layer.

The resin layer may be formed of a photoresist resin.

The resin layer may further include an uneven portion on a surface thereof around the trench.

The dam member may be formed along a circumference of the mounting region.

The flip chip package may further include a bump formed on the connection pad and electrically connected with the electronic device.

The flip chip package may further include the underfill interposed between the electronic device and the board.

According to another aspect of the present invention, there is provided a flip chip package including: an electronic device; a board including a conductive pad disposed inside a mounting region of the board on which the electronic device is mounted, and a connection pad disposed outside the mounting region; a resin layer formed on the board and including an uneven portion at a part of a surface of the resin layer; and a dam member provided on the uneven portion and preventing leakage of an underfill between the mounting region and the connection pad.

The uneven portion may be formed by performing a coining process on the resin layer.

The uneven portion may be formed by exposing and developing the resin layer.

The resin layer may be formed of a photoresist resin.

The dam member may be formed along a circumference of the mounting region.

The flip chip package may further include a bump formed on the connection pad and electrically connected with the electronic device.

The flip chip package may further include the underfill interposed between the electronic device and the board.

According to another aspect of the present invention, there is provided a method of manufacturing a flip chip package, the method including: providing a board including a conductive pad disposed inside a mounting region of the board on which the electronic device is to be mounted, and a connection pad disposed outside the mounting region; forming a resin layer on the board; forming a trench by removing a part of the resin layer; forming a dam member on the trench, the dam member preventing leakage of an underfill between the mounting region and the connection pad; and mounting the electronic device on the mounting region.

The forming of the trench may be performed by processing the resin layer using a laser.

The forming of the trench may be performed by exposing and developing the resin layer.

The resin layer may be formed of a photoresist resin.

An uneven portion may be further formed at a surface of the resin layer around the trench.

The dam member may be formed along a circumference of the mounting region.

The method may further include forming a bump on the connection pad, the bump being electrically connected with the electronic device.

The method may further include injecting the underfill between the electronic device and the board.

According to another aspect of the present invention, there is provided a method of manufacturing a flip chip package, the method including: providing a board including a conductive pad disposed inside a mounting region of the board on which the electronic device is to be mounted, and a connection pad disposed outside the mounting region; forming a resin layer on the board; forming an uneven portion at a portion of a surface of the resin layer; forming a dam member on the uneven portion, the dam member preventing leakage of an underfill between the mounting region and the connection pad; and mounting the electronic device on the mounting region.

The forming of the uneven portion may be performed by performing a coining process on the resin layer.

The forming of the uneven portion may be performed by exposing and developing the resin layer.

The resin layer may be formed of a photoresist resin.

The dam member may be formed along a circumference of the mounting region.

The method may further include forming a bump on the connection pad, the bump being electrically connected with the electronic device.

The method may further include injecting the underfill between the electronic device and the board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
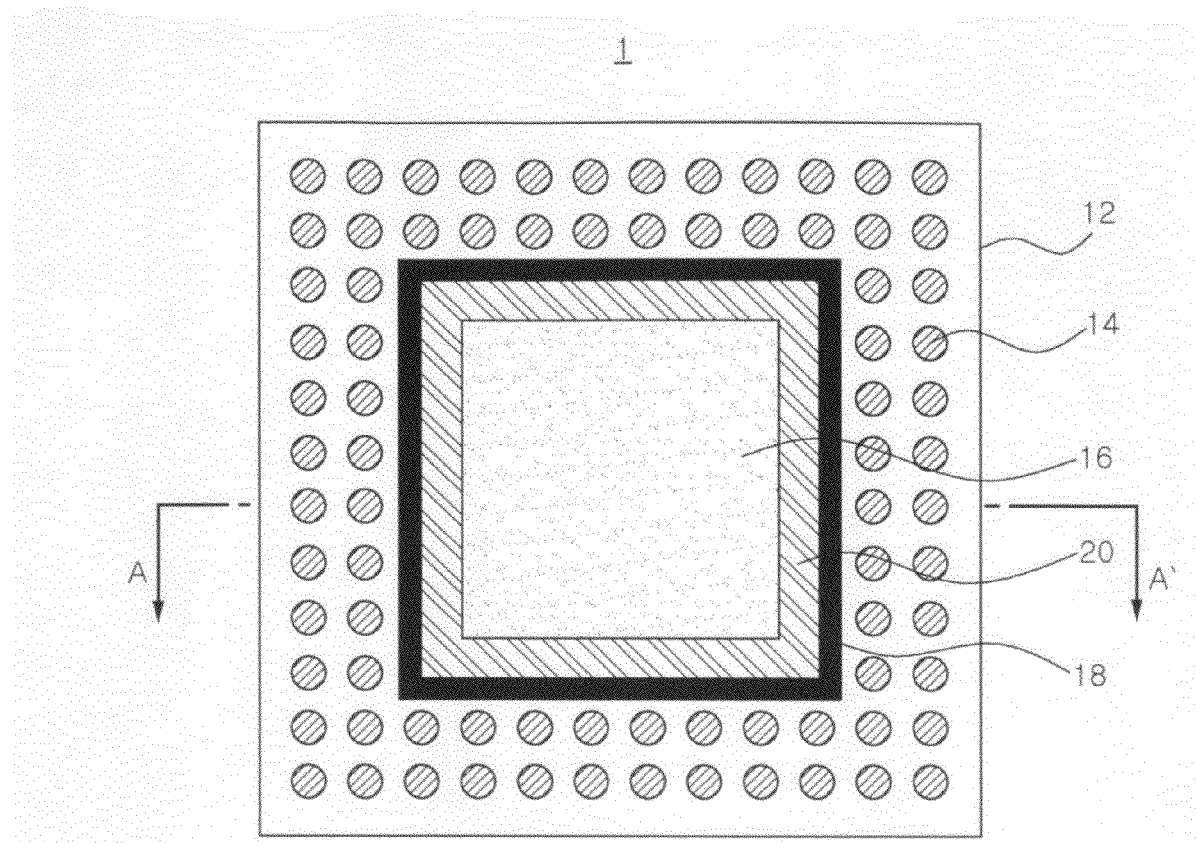
FIG. 1 is a schematic plan view illustrating the top portion of a flip chip package according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shape and size of elements may be exaggerated for clarity. Like reference numerals in the drawings denote like elements A flip chip package, according to an exemplary embodiment of the present invention, will now be described in detail with reference to FIGS. 1 and 2.

Figure 2:
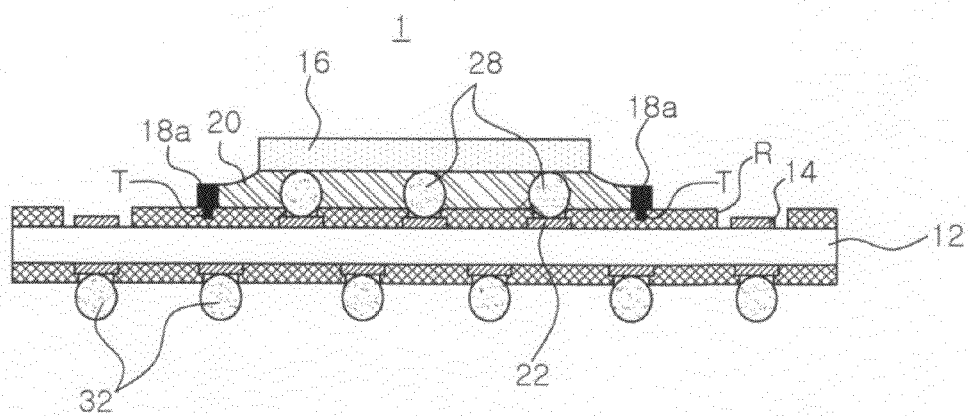
FIG. 2 is a cross-sectional view taken along line A-A' of FIG. 1.

FIG. 1 is a schematic plan view illustrating the top portion of a flip chip package according to an exemplary embodiment of the present invention. FIG. 2 is a cross-sectional view taken along line A-A' of FIG. 1.

As shown in FIGS. 1 and 2, a flip chip package 1, according to an exemplary embodiment of the present invention, includes: an electronic device 16; a board 12 on which conductive pads 22 are formed inside a mounting region in which the electronic device 16 is mounted, while connection pads 14 are formed outside the mounting region; a resin layer R formed on the board 12 and having a trench T formed by removing a part of the resin layer R; and a dam member 18 provided between the connection pads 14 and the mounting region where the electronic device 16 is mounted, the dam member 18 preventing the leakage of an underfill 20; and bumps 28 formed on the connection pads 22 and electrically connected with the electronic device 16 therebetween.

According to this exemplary embodiment, the flip chip package 1, including the electronic device 16 mounted on the board 12, achieves a reinforced connection between the electronic device 16 and the board 12 due to the underfill 20 injected into a gap created between the electronic device 16 and the board 12.

The connection pads 14 are formed outside the mounting region of the board 12 on which the electronic device 16 is mounted. This mounting region may also be referred to as an electronic device mounting region. The electronic device mounting region refers to a region of the board 12 covered by the electronic device 16 when the electronic device 16 is mounted on the board 12. The electronic device 16 is mounted on the electronic device mounting region. When the board 12 and the electronic device 16 are electrically connected with each other, the gap is created between the board 12 and the electronic device 16.

The electronic device 16 is a concept that covers both an active device such as a semiconductor chip or the like and a passive device such as a capacitor, an inductor, a resistor or the like. Regarding this exemplary embodiment, a description will be made using a semiconductor chip as merely one example of the electronic device.

A liquid underfill 20 is injected between the board 12 and the electronic device 16 to thereby ensure a reliable connection between the board 12 and the electronic device 16. Since this underfill 20 is a liquid resin, a portion of underfill 20 leaks to a surrounding portion at the time when the underfill 20 is injected into the gap between the board 12 and the electronic device 16.

The underfill 20 filling the gap between the board 12 and the electronic device 16 may utilize an epoxy resin having low viscosity. Due to the development of smaller and smaller electronic devices with higher densities, high-density mounting needs to be used, even in packaging technology for mounting the electronic device 16. This causes the gap formed by the board 12 and the electronic device 16 to decrease in width, and thus the liquid underfill 20 may be injected by using a capillary phenomenon. This is because the injection of the underfill is facilitated when it has a low level of viscosity.

While the underfill 20, having a low level of viscosity, may easily fill the gap formed between the board 12 and the electronic device 16, it may, however, easily leak undesirably into a surrounding portion. For this reason, the dam member 18a is formed between the electronic device mounting region and the connection pad 14, so that the underfill 20, having a low level of viscosity, can be prevented from flowing to the connection pad 14.

The resin layer R, disposed on the board 12, is provided with the trench T formed by removing a part of the resin layer R.

Here, the trench T may be formed by processing the resin layer R using a laser. Alternatively, the trench T may be formed by exposing and developing the resin layer R made of a photoresist resin. However, the method of forming the trench T is not limited to the methods described.

In this case, the dam member 18a is formed on the trench T. Here, the dam member 18a is formed between the electronic device mounting region and the connection pad 14 in order to prevent the underfill 20 having a low level of viscosity from flowing over to the connection pad 14.

Figure 4:
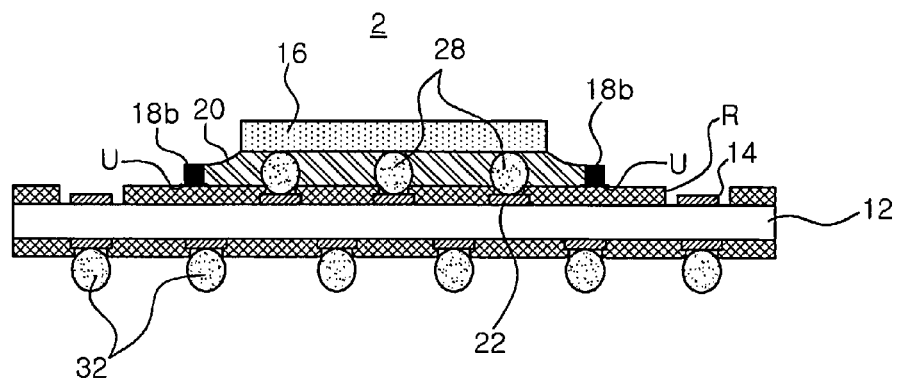
FIG. 4 is a schematic cross-sectional view illustrating a flip chip package according to another exemplary embodiment of the present invention.

Furthermore, as in a flip chip package 2 according to another exemplary embodiment of the present invention illustrated in FIG. 4, the resin layer R, disposed on the board 12, may have an uneven portion U on a part of its surface.

Here, the uneven portion U may be formed by performing a coining process on the resin layer R. Alternatively, the resin layer R, formed of a photoresist resin, may be exposed and developed to thereby form the uneven portion U. However, the method of forming the uneven portion U is not limited to the described methods.

In this case, a dam member 18b (see FIG. 4) is formed on the uneven portion U. Here, the dam member 18b is formed between the electronic device mounting region and the connection pad 14 in order to prevent the underfill 20, having a low level of viscosity, from flowing over to the connection pad 14.

Figure 5:
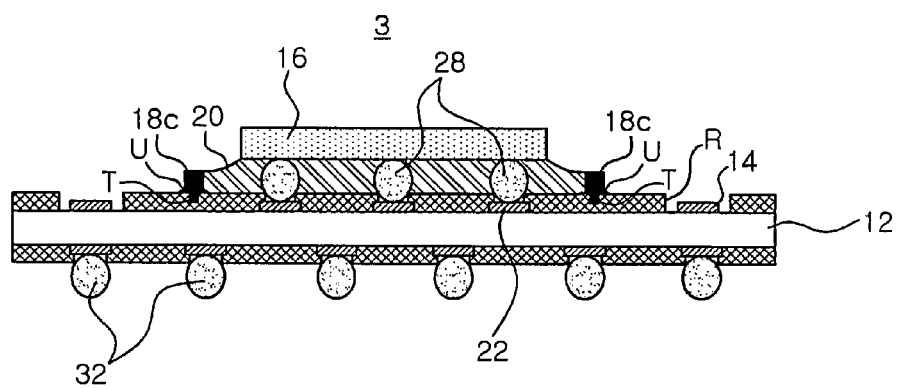
FIG. 5 is a schematic cross-sectional view illustrating a flip chip package according to another exemplary embodiment of the present invention.

Furthermore, as in a flip chip package 3 according to another exemplary embodiment of the present invention illustrated in FIG. 5, the resin layer R, disposed on the board 12, may have both an uneven portion U and a trench T at a part of the surface of the resin layer R. Here, the trench T is formed by removing a part of the resin layer R.

In this case, a dam member 18c (see FIG. 5) is formed on the uneven portion U and the trench T. Here, the dam member 18c is formed between the electronic device mounting region and the connection pad 14 in order to prevent the underfill having a low level of viscosity from flowing over to the connection pad 14.

As the contact area between the dam member 18 (18a to 18c) and the resin layer R increases throughout the above embodiments, the dam member 18 is not easily separated from the resin layer R by external shock or is not misarranged. Accordingly, defects caused by damage to the dam member 18 can be reduced, the manufacturing yield for the package 1 can be improved, and defects resulting from the leakage of the underfill 20 to a surrounding portion can also be reduced. Furthermore, issues regarding volatile organic compounds (VOC), which may leak from the package 1 due to the defective dam member 18, can be solved.

Here, the dam member 18 may be formed by discharging insulating ink using an inkjet printing method. Alternatively, a previously formed dam member 18 may be attached to the resin layer R by a bonding agent, or may be formed using a photolithography method or a screen printing method. However, the method of forming the dam member 18 is not limited to the methods described.

Referring to FIG. 1, the dam member 18 is illustrated as being formed in a continuous manner along the circumference of the electronic device mounting region. However, the shape of the dam member 18 is not limited to that depicted in the illustration. For example, the dam member 18 may be irregularly discontinued. Alternatively, the dam member 18 may be provided in the form of a plurality of dots arranged at predetermined intervals.

Such a dam member 18 can prevent the leakage of the underfill 20 to a surrounding part even when the underfill 20 being used has a low level of viscosity. Thus, the dam member 18 contributes to preventing defects from occurring in the package 1 due to the leakage of the underfill 20.

Hereinafter, the process of manufacturing a flip chip package, according to an exemplary embodiment of the present invention, will be described in detail with reference to FIGS. 3A through 3F.

FIGS. 3A through 3F are schematic cross-sectional views illustrating the process of manufacturing a flip chip package according to an exemplary embodiment of the present invention.

As shown in FIGS. 3A through 3F, the process of manufacturing the flip chip package, according to an exemplary embodiment of the present invention, includes: providing a board 12 on which conductive pads 22 are formed inside a mounting region on which an electronic device 16 is to be mounted, while connection pads 14 are formed outside the mounting region; forming a resin layer R on the board 12; forming a trench T by removing a part of the resin layer R; forming a dam member 18 (18a to 18c) on the trench T, the dam member 18 preventing the leakage of an underfill 20 from the mounting region for the electronic device 16 to the connection pads 14; and mounting the electronic device 16 on the mounting region for the electronic device 16 (hereinafter also "electronic device mounting region).

Figure 3A:
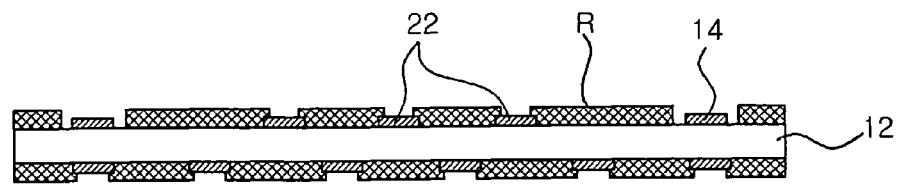
FIGS. 3A through 3F are schematic cross-sectional views illustrating the process of manufacturing a flip chip package according to another exemplary embodiment of the present invention.

First, as shown in FIG. 3A, there is provided the board including the conductive pads 22 disposed inside the electronic device mounting region, and the connection pads 14 disposed outside the electronic device mounting region. Thereafter, the resin layer R, exposing the conductive pads 22 and the connection pads 14, is formed on the board 12.

The connection pads 14 are formed on the board 12 outside the mounting region of the board for the mounting of the electronic device 16, and the conductive pads 22 are formed inside the mounting region. Here, the conductive pads 22 serve to make an electrical connection between the electronic device 16 and the board 12.

The electronic device mounting region refers to a region of the board 12 covered by the electronic device 16 when the electronic device 16 is mounted on the board 12. The electronic device 16 is mounted on the electronic device mounting region. When the board 12 and the electronic device 16 are electrically connected with each other, a gap is created between the board 12 and the electronic device 16.

The electronic device 16 is a concept that covers both an active device such as a semiconductor chip or the like and a passive device such as a capacitor, an inductor, a resistor or the like. Regarding this exemplary embodiment, a description will be made using a semiconductor chip as merely one example of the electronic device.

Other active or passive devices may be mounted on the connection pads 14. The electronic device 16 can be electrically connected with external devices through the connection pads 14. Foreign substances on the connection pads 14 may impair electrical connectivity with active devices, passive devices and external devices. For example, if the underfill 20 for reinforcing the connection between the electronic device 16 and the board 12 leaks and covers the connection pads 14, the reliability of electrical connections can be degraded.

Figure 3B:
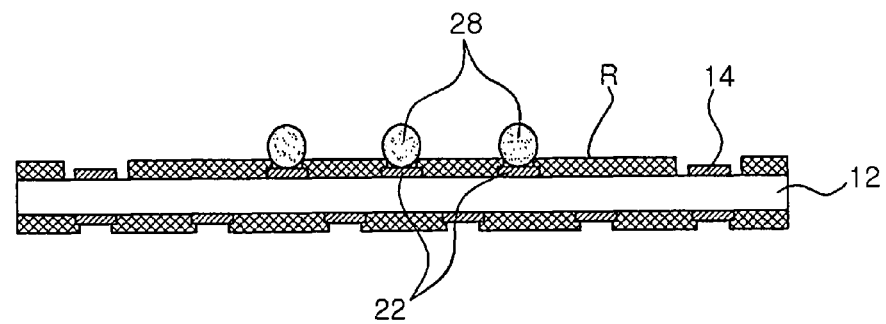

Thereafter, as shown in FIG. 3B, bumps 28 for an electrical connection with the electronic device 16 are formed on the respective conductive pads 22. A screen printing method may be used in order to form the bumps 28 on the conductive pads 22 placed on the electronic device mounting region. However, the formation of the bumps 28 is not limited to the method described. It is apparent that bumps 28 may be formed using a variety of methods known to those killed in the art. The electronic device 16 and the board 12 are electrically connected with each other by those bumps 28.

Figure 3C:
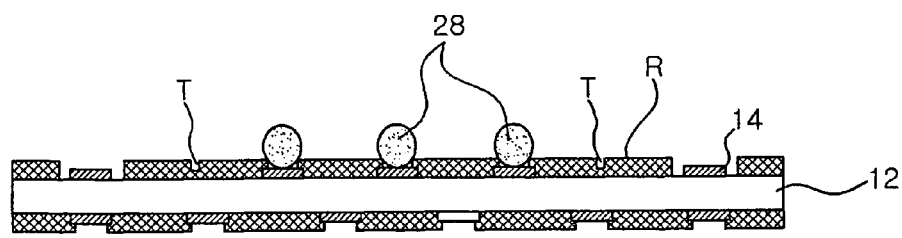

Thereafter, as shown in FIG. 3C, the trench T is formed by removing a part of the resin layer R disposed on the board 12.

Here, the trench T may be formed by processing the resin layer R using a laser. Alternatively, the trench T may be formed by exposing and developing the resin layer R, formed of a photoresist resin. However, the formation of the trench T is not limited to the methods described.

Figure 3D:
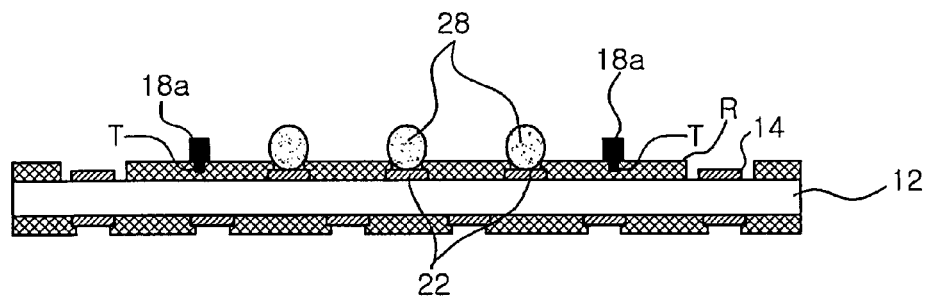

Thereafter, as shown in FIG. 3D, a dam member 18a is formed on the trench T. Here, the dam member 18a is formed between the electronic device mounting region and the connection pads 14 in order to prevent the underfill 20 having a low level of viscosity from leaking toward the connection pads 14.

In this embodiment, the dam member 18a is illustrated as being formed on the trench T provided in the resin layer R. However, the shape of the dam member 18a is not limited to that of the illustration.

As in a flip chip package 2 according to another exemplary embodiment of the present invention illustrated in FIG. 4, the resin layer R, disposed on the board 12, may have an uneven portion U at a part of its surface.

Here, the uneven portion U may be formed by performing a coining process on the resin layer R. Alternatively, the uneven portion U may be formed by exposing and developing the resin layer formed of a photoresist resin. However, the method of forming the uneven portion U is not limited to the methods described.

In this case, a dam member 18b (see FIG. 4) is formed on the uneven portion U. Here, the dam member 18b is formed between the electronic device mounting region and the connection pad 14 in order to prevent the underfill 20, having a low level of viscosity, from flowing over to the connection pad 14.

Furthermore, as in a flip chip package 3 according to another exemplary embodiment of the present invention illustrated in FIG. 5, the resin layer R, disposed on the board 12, may have both an uneven portion U and a trench T at a part of the surface of the resin layer R. Here, the trench T is formed by removing a part of the resin layer R.

In this case, a dam member 18c (see FIG. 5) is formed on the uneven portion U and the trench T. Here, the dam member 18c is formed between the electronic device mounting region and the connection pad 14 in order to prevent the underfill having a low level of viscosity from flowing over to the connection pad 14.

As the contact area between the dam member 18 (18a to 18c) and the resin layer R increases throughout the above embodiments, the dam member 18 is not easily separated from the resin layer R by external shock or is not misarranged. Accordingly, defects caused by damage to the dam member 18 can be reduced, the manufacturing yield for the package 1 can be improved, and defects resulting from the leakage of the underfill 20 to a surrounding portion can also be reduced. Furthermore, issues regarding volatile organic compounds (VOC), which may leak from the package 1 due to the defective dam member 18, can be solved.

Here, the dam member 18 may be formed by discharging insulating ink using an inkjet printing method. Alternatively, the dam member 18 may be formed in advance and attached to the resin layer R by a bonding agent, or may be formed using a photolithography method or a screen printing method. However, the method of forming the dam member 18 is not limited to the methods described.

Referring to FIG. 1, the dam member 18 is illustrated as being formed in a continuous manner along the circumference of the electronic device mounting region. However, the shape of the dam member 18 is not limited to that of the illustration. For example, the dam member 18 may be irregularly discontinued. Alternatively, the dam member 18 may be provided in the form of a plurality of dots arranged at predetermined intervals.

Such a dam member 18 can prevent the leakage of the underfill 20 toward a surrounding part even when the underfill 20 being used has a low level of viscosity. Thus, the dam member 18 contributes to preventing defects from occurring in the package 1 due to the leakage of the underfill 20.

Figure 3E:
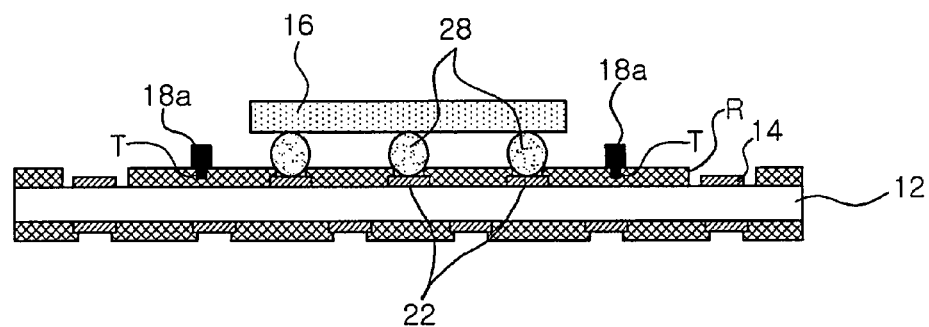

Thereafter, as shown in FIG. 3E, the electronic device 16 is mounted on the electronic device mounting region of the board 12. The electronic device mounting region is a region of the board covered by the electronic device 16 when the electronic device 16 is mounted on the board 12. The electronic device 16 is mounted on the electronic device mounting region. When the board 12 and the electronic device 16 are electrically connected with each other, a gap is created between the board 12 and the electronic device 16.

In the process of mounting the electronic device 16 on the board 12, an electrical connection between the board 12 and the electronic device 16 is necessary. Thus, the process of mounting the electronic device 16 may include the process of electrically connecting the electrode device 16 and the bumps 28 by using a flip chip bonding method. That is, the conductive pads 22, corresponding to the terminals of the electronic device 16, are formed in the electronic device mounting region, and the bumps 28 are formed on the respective conductive pads 22 according to the above described process. Thus, the bumps 28 and the terminals of the electronic device 16 are electrically connected with each other by using a flip chip bonding method. The flip chip bonding process is performed by applying a flux for reflow to the bumps 28 and melting the bumps 28 through reflow heating, electrically connecting the bumps 28 with the electronic device 16. The flux for reflow, applied to the board 12, is subsequently removed by a washing process.

Figure 3F:
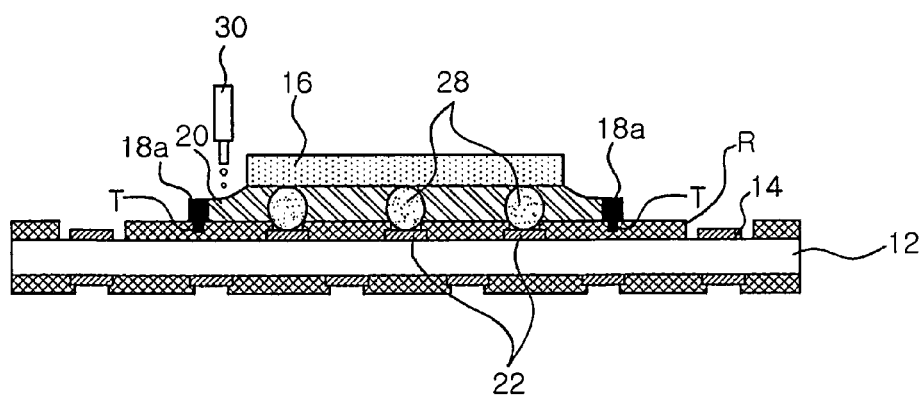

Thereafter, as shown in FIG. 3F, an underfill 20 is injected between the electronic device 16 and the board 12. As described above, a gap is created between the board 12 and the electronic device 16 in the process of electrically connecting the electronic device 16 with the bumps 28. This gap may bring about problems regarding connection reliability between the electronic device 16 and the board 12.

A nozzle of a dispenser 30 is placed between the dam member 18 and the outer side of the electronic device 16, and thus injects the liquid underfill 20. Then, the injected underfill 20 flows under the electronic device. 16. In this process, the liquid underfill 20 may leak to a surrounding part. However, the dam member 18, formed between the electronic device region and the connection pads 14, blocks the leakage of the underfill 20 toward the connection pads 14. In such a manner, the connection pads 14 are protected from the leaked underfill 20.

The underfill 20 fills the gap created between the board 12 and the electronic device 16, and may be formed of an epoxy resin having a low level of viscosity. Even a packaging technology for mounting the electronic device 16 demands high-density mounting according to the current trend toward slimmer, smaller electronic devices with higher density. For this reason, the gap between the board 12 and the electronic device 16 has a reduced width. Thus, the liquid underfill 20, when injected, may fill the gap by a capillary phenomenon. This may be performed more easily when the underfill 20 has a low level of viscosity.

However, the underfill 20, having such a low level of viscosity, may easily fill the gap created by the board 12 and the electronic device 16, but easily leak to a surrounding part. The leakage of the underfill 20 toward the connection pads 14 can be prevented by forming the dam member 18 between the electronic device mounting region and the connection pads 14.

Thereafter, as shown in FIG. 2, solder balls 32 are formed on the bottom surface of the board 12, thereby completing the flip chip package 1.

According to the flip chip package and the method of manufacturing the same according to the exemplary embodiments of the present invention, the dam member is formed on the processed resin layer to thereby prevent the leakage of the underfill. This can lower a package defect rate, and improve the reliability of a connection.

According to the flip chip package and the method of manufacturing the same according to the exemplary embodiments of the present invention, a high degree of design freedom can be achieved and a process can be shortened, thereby reducing manufacturing costs.

Furthermore, issues regarding volatile organic compounds (VOC), which may leak from the package due to the defective dam member, can be solved.

As set forth above, according to exemplary embodiments of the invention, there can be provided the flip chip package, capable of lowering a package defect rate and improving connection reliability by forming the dam member on the processed resin layer to prevent the leakage of the underfill, and the method of manufacturing the same.

Also, there can be provided the flip chip package, capable of achieving a high degree of design freedom and shortening a process to thereby reduce manufacturing costs, and the method of manufacturing the same.

Furthermore, issues regarding volatile organic compounds (VOC), which may leak from the package due to the defective dam member, can be solved.

While the present invention has been shown and described in connection with the exemplary embodiments, it will be apparent to those skilled in the art that modifications and variations can be made without departing from the spirit and scope of the invention as defined by the appended claims.

What is claimed is:

1. A flip chip package comprising:
   an electronic device;
   a board including a conductive pad disposed inside a mounting region of the board on which the electronic device is mounted, and a connection pad disposed outside the mounting region;
   a resin layer disposed on the board and including a trench formed by removing a part of the resin layer; and
   a dam member provided on the trench and preventing leakage of an underfill between the mounting region and the connection pad.

2. The flip chip package of claim 1, wherein the trench is formed by processing the resin layer using a laser.

3. The flip chip package of claim 1, wherein the trench is formed by exposing and developing the resin layer.

4. The flip chip package of claim 3, wherein the resin layer is formed of a photoresist resin.

5. The flip chip package of claim 1, wherein the resin layer further includes an uneven portion on a surface thereof around the trench.

6. The flip chip package of claim 1, wherein the dam member is formed along a circumference of the mounting region.

7. The flip chip package of claim 1, further comprising a bump formed on the connection pad and electrically connected with the electronic device.

8. The flip chip package of claim 1, further comprising the underfill interposed between the electronic device and the board.

9. A flip chip package comprising:
   an electronic device;
   a board including a conductive pad disposed inside a mounting region of the board on which the electronic device is mounted, and a connection pad disposed outside the mounting region;
   a resin layer formed on the board and including an uneven portion at a part of a surface of the resin layer; and
   a dam member provided on the uneven portion and preventing leakage of an underfill between the mounting region and the connection pad.

10. The flip chip package of claim 9, wherein the uneven portion is formed by coining the resin layer.

11. The flip chip package of claim 9, wherein the uneven portion is formed by exposing and developing the resin layer.

12. The flip chip package of claim 11, wherein the resin layer is formed of a photoresist resin.

13. The flip chip package of claim 9, wherein the dam member is formed along a circumference of the mounting region.

14. The flip chip package of claim 9, further comprising a bump formed on the connection pad and electrically connected with the electronic device.

15. The flip chip package of claim 9, further comprising the underfill interposed between the electronic device and the board.

* * * * *